(12) United States Patent
Park

(10) Patent No.: US 6,967,436 B2
(45) Date of Patent: Nov. 22, 2005

(54) MATRIX-TYPE TRIODE ORGANIC ELECTROLUMINESCENT DISPLAY

(76) Inventor: Byoung-Choo Park, 101-602, Daejin-1cha Apt., Jukjeon-ri, Suji-eup, Yongin-city, 449-752 Kyonggi-do (KR)

( * ) Notice: Subject to any disclaimer, the term of this patent is extended or adjusted under 35 U.S.C. 154(b) by 0 days.

(21) Appl. No.: 10/943,085

(22) Filed: Sep. 16, 2004

(65) Prior Publication Data

US 2005/0067946 A1    Mar. 31, 2005

Related U.S. Application Data

(63) Continuation of application No. PCT/KR03/00485, filed on Mar. 13, 2003.

(30) Foreign Application Priority Data

Mar. 18, 2002 (KR) .................. 10-2002-0014600

(51) Int. Cl.[7] .................. H05B 33/06; H01L 31/12
(52) U.S. Cl. .................. 313/504; 313/500; 313/506; 257/40; 345/76
(58) Field of Search .................. 313/500–506, 313/509, 498; 257/20, 24, 40; 345/76, 92

(56) References Cited

U.S. PATENT DOCUMENTS 5,563,424 A * 10/1996 Yang et al. .................. 257/40
6,614,177 B2 * 9/2003 Kanno et al. .................. 313/506
2003/0015698 A1 * 1/2003 Baldo et al. .................. 257/40

FOREIGN PATENT DOCUMENTS

| JP | 10-214042 | 8/1998 |
|---|---|---|
| JP | 10-214044 | 8/1998 |
| JP | 10-241859 | 9/1998 |
| KR | 2001-83584 | 10/2002 |

* cited by examiner

Primary Examiner—Karabi Guharay
Assistant Examiner—Sikha Roy
(74) Attorney, Agent, or Firm—St. Onge Steward Johnston & Reens LLC

(57) ABSTRACT

A matrix-type organic electro-luminescent display (OELD) having triode organic EL device is provided. The first electrode that may be an anode or cathode is formed on the substrate. After a patterned electrically insulating layer is formed on the substrate and the first electrode, the second electrode for controlling the potential of the anode or the cathode is formed on the insulating layer so that the first electrode and the second electrode are formed at a different plane. And then an organic EL layer and third electrode (cathode or anode) are sequentially formed on the substrate. The organic EL layer is electrically connected to the first and the third electrodes in the emission part of the OELD, while the organic EL layer is electrically connected to the second electrodes in the non-emission part of the OELD for controlling potential between the anode and an organic EL layer or the cathode and the organic EL layer. Accordingly it is possible to realize matrix-type display having triode organic EL device showing high brightness with low power consumption.

16 Claims, 9 Drawing Sheets

MATRIX-TYPE TRIODE ORGANIC ELECTROLUMINESCENT DISPLAY

This application is a continuation of pending International Patent Application No. PCT/KR2003/000485 filed Mar. 13, 2003 which designates the United States and claims priority of pending Korean Patent Application No. 2002-14660 filed Mar. 18, 2002.

FIELD OF THE INVENTION

The present invention relates to a matrix-type organic electroluminescent display (OELD), and more particularly to, a matrix-type triode (three terminal) OELD showing high and uniform brightness of luminance under low driving voltage and having high yield for production.

BACKGROUND OF THE INVENTION

Recently, a two-terminal organic electroluminescent (EL) device has been suggested as a self-emission display device, and thus an OELD panel or an OELD device employing the two-terminal organic EL device has been actively developed.

The typical two-terminal organic EL device is referred to as an organic light emitting diode (OLED). The OLED has a pair of electrodes, an anode and a cathode, together with an organic EL layer interposed between the anode and the cathode. The representative OLED has a multi-layered structure of anode/hole transport layer (HTL)/organic light-emitting layer (EML)/electron transport layer(ETL)/cathode, which was suggested by Tang et al. The OLED having the multi-layered structure of (HTL/EML/ETL) exhibits high luminescent efficiency and thus has been adopted in almost all kinds of current OELDs under the development. Further, a hole injection layer (HIL) may be further formed between the anode and HTL or an electron injection layer (EIL) may be further formed between ETL and the cathode.

When a voltage is applied to the OLED, the electrons from the cathode and the holes from the anode are injected into EML, and thereafter the recombination of the injected holes and electrons at EML excites the emitting centers, thereby emitting EL lights. In the present specification, all layers interposed between the anode and the cathode are referred to as an "EL layer". Therefore, the EL layer can include the above-mentioned HIL, HTL, EML, ETL and EIL. Moreover, a single organic layer can also be used to form the EL layer. Also, luminescence of the EL device in the present specification is referred to as a "driving of the EL device".

Driving system of the OELD includes a passive matrix type system and an active matrix type system. The passive matrix type OELD has an anode of transparent electrode in the form of stripe patterns on a transparent insulating substrate, an organic EL layer and a cathode of metal in the form of stripes perpendicular to the anode stripes, which are sequentially formed.

In the passive matrix type OELD, one of scanning lines of cathode (or anode) is selected and one or more data signal lines of anode (or cathode) among a plurality of data signal lines are selected, then, luminescence is generated from the pixels connected to the selected scanning line and the selected data signal lines. Data signal (or video signal) inputted from an outside is edited by a signal driving circuit, thereby transporting data signal to a signal line. Integrated circuit (IC) chip for the signal line driving circuit may be mounted on a display device in a manner of tape automated bonding (TAB) or may be directly bonded to a pixel substrate, thereby being assembled with the display device.

The active matrix type OELD includes a driving semiconductor element and a switching semiconductor element wherein those are prepared for each of a plurality of pixels arranged in the form of matrix type. The semiconductor elements are connected to one of the electrodes, the cathode and the anode, of the OELD, thereby controlling current flow through the OELD. Unit pixel of the active matrix type OELD includes an OLED and a transistor (or transistors) having a semiconductor film formed on an insulating substrate. Here, the transistor having a semiconductor film is hereinafter referred to as "a thin film transistor (TFT)".

The active matrix type OELD has a plurality of OLEDs, a plurality of gate signal lines, a plurality of source signal lines, a plurality of power supply lines, a plurality of TFTs for driving and switching, and a plurality of capacitors, which are formed on the insulating substrate. Generally, at least two TFTs including at least one switching TFT and at least one driving TFT and one capacitor are provided for each of pixels in the active matrix-type OELD.

As described above, the OLED is a self-emitting device having high brightness and it does not require a backlight source, so the thickness and weight of the OLED display can be relatively reduced in comparison with a conventional liquid crystal display (LCD). By the above-mentioned reasons, it is a trend that the OELD is used as a display section of a portable information terminal such as a mobile computer, a mobile telephone, a mobile game player or an electronic book etc., instead of the LCD. The development of the OELD having a higher brightness of luminance under a lower operating voltage and having high production yield to accommodate the present trend, has been continuously required.

SUMMARY OF THE INVENTION

An object of the present invention is to provide an OELD having a high brightness of luminance under a low operating voltage and having high production yield.

In order to achieve the object of the present invention, a matrix-type OELD having a three-terminal (or triode) organic EL device comprises a plurality of first electrodes in the form of stripes on a substrate; a patterned insulating layer with exposing parts of the plurality of first electrodes; a plurality of second electrodes formed on a part of the insulating layer excepting the exposed active parts of the plurality of first electrodes; an EL layers formed on a resultant structure having the plurality of second electrodes in the region which covers the exposed active parts of the plurality of the first electrodes and parts of the plurality of the second electrodes; and a plurality of electrode stripes formed on the EL layer perpendicular to the first electrode stripes.

In an embodiment, each of the plurality of second electrodes can be patterned in the form of stripes crossing the plurality of first electrode stripes on the insulating layer except for the exposed active parts of the plurality of the first electrodes. Also, the matrix-type OELD further comprises a plurality of separators which are formed with crossing the plurality of first electrode stripes on the plurality of second electrodes.

More specifically, the plurality of separators and the plurality of second electrodes may be arranged by a ratio of 1:1, i.e., parts of the plurality of separators cover parts of the plurality of second electrodes while the other parts of the plurality of separators cover parts of the insulating layer. In another embodiment, the plurality of separators and the plurality of second electrodes are arranged by a ratio of 1:1 and width of each of the plurality of separators is less than that of each of the plurality of second electrodes. In still another embodiment, the plurality of separators and the plurality of second electrodes are arranged by a ratio of 2:1 so that the plurality of separators are formed on the plurality of second electrodes and on the insulating layer positioned between adjacent two second electrodes. Here the width of each of the plurality of separators is less than that of each of the plurality of second electrodes.

As another embodiment, each of the plurality of second electrodes is made in forms of stripes parallel to the plurality of first electrodes on the insulating layer excepting the exposed active parts of the plurality of first electrodes. In this case, the organic EL layer may be composed of a plurality of sub-organic EL layers, each of which is separated from one another in an arrangement direction of the plurality of first electrodes or the organic EL layer may be formed on entire surface of the resultant having the second electrodes and the separators.

Also, a plurality of separators and the plurality of second electrodes are arranged by a ratio of 2:1. Here the organic EL layer is composed of a plurality of sub-organic layers, each of which is positioned from an one end of the insulating layer on which the plurality of second electrodes are not formed to one end of next adjacent insulating layer on which the plurality of second electrodes are not formed.

In addition, each of the plurality of second electrodes includes a first portion crossing the plurality of first electrodes and a plurality of second portions which are branched from the first portion to regions between adjacent first electrodes. And, a plurality of the second electrodes is formed on whole surface of the insulating layer excepting the exposed active parts of the plurality of first electrodes.

DETAILED DESCRIPTION OF EMBODIMENTS

In briefly explaining features of the present invention, the luminescent process of the present matrix-type OELD is controlled by electrically connecting a three-terminal (or triode) organic light emitting device to a semiconductor device for driving so that the luminescent efficiency can be enhanced, while the luminescent process of the conventional matrix-type OELD is controlled by electrically connecting an conventional two-terminal organic light emitting diode device to the semiconductor device. Hereafter, the three-terminal organic EL device is referred to as a "triode organic EL device".

Figure 1A:
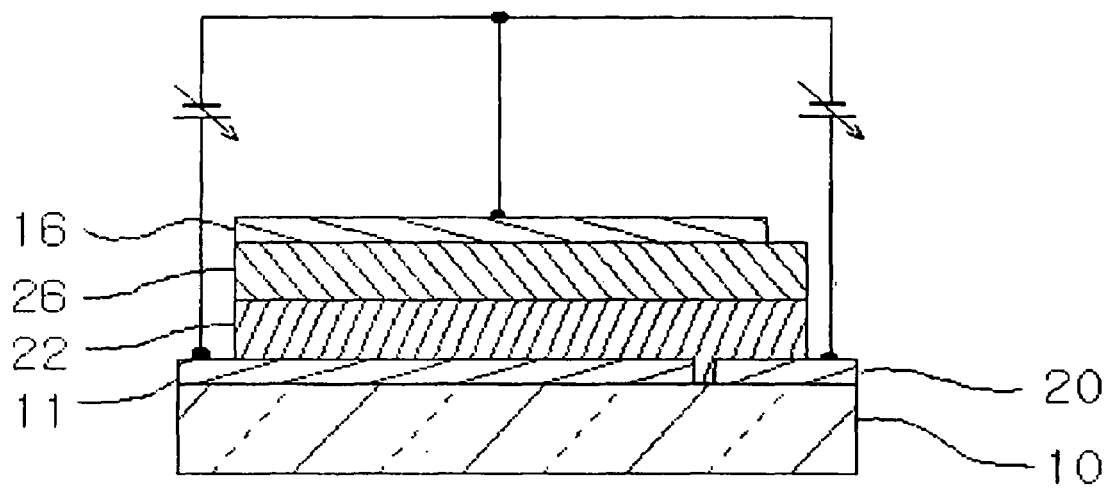
FIG. 1a shows a schematic cross-sectional diagram of a three-terminal (or triode) organic EL device in accordance with one embodiment, which is used in a matrix-type OELD of the present invention.
Figure 1B:
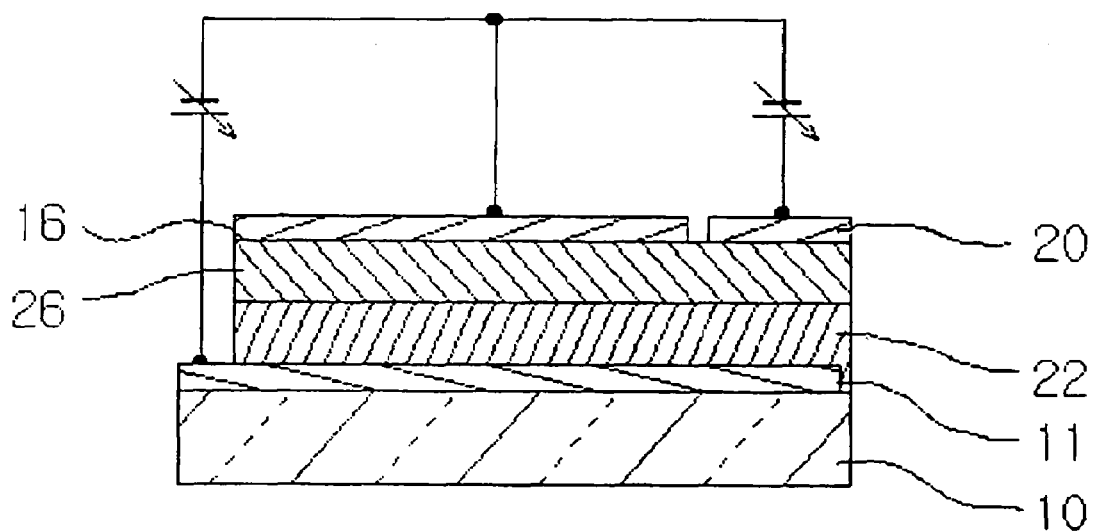
FIG. 1b shows a schematic cross-sectional diagram of a three-terminal (or triode) organic EL device in accordance with another embodiment, which is used in a matrix-type OELD of the present invention.

Examples of the above-mentioned triode EL devices are shown in FIGS. 1a and 1b. Referring to FIG. 1a, the triode EL device includes a substrate 10, a first electrode 11 serving as an anode (A) formed on the substrate 10, an organic EL layer which may include a first organic layer 22 and/or a second organic layer 26, formed on the first electrode 11, a second electrode 16 serving as a cathode (C) formed on the organic EL layer 22 and/or 26 with being opposite to the first electrode 11, and a third electrode 20 formed under the organic EL layer 22 and/or 26 for controlling a relative potential of the organic EL layer 22 and/or 26. And the third electrode 20 may be formed on the organic EL layer 22 and/or 26 as shown in FIG. 1b.

Wherein, the third electrode 20 is formed outside of a crossed region between the first electrode 11 and the second electrode 20. The third electrode 20 is made of a conductive organic material, a conductive inorganic material, a metal or complex thereof, preferably one selected from a group consisting of ITO, Ag, Al, Mg, Ca, Li, and compound thereof.

The position and shape of the third electrode 20 are not specifically limited. But, if the third electrode 20 is formed within the crossed region between the anode 11 and the cathode 16 in the forms of porous networks or grids, the third electrode 20 may shield an electric field between the anode 11 and the cathode 16. Thus, the injection and transportation of the charge carriers are directly obstructed and then light-emitting active area may be reduced seriously. Accordingly, the third electrode 20 is preferably formed outside of the crossed region, which is defined the region between the anode 11 and the cathode 16, to overcome the above problem. Also, the third electrode 20 may be encapsulated by insulating organic or inorganic materials. The third electrode 20 is also connected to an external circuit so as to have negative or positive potential, thereby current flow through the organic EL layer can be controlled and thus the brightness of luminance can be also controlled.

The organic EL layer may include a first organic layer 22 and/or the second organic layer 26, which are composed of HIL, HTL, EML and ETL.

The organic EML can be made of various conventional chemical compound used in manufacturing an OELD and preferably can be made of organic luminescent monomer, oligomer, or polymer which is conductive, non-conductive, or semi-conductive. The organic monomer may be tris(8- quinolinolato aluminum) ($Alq_3$), bis(10-hydroxybenzo[h]quinolinato)beryllium complex ($BeBq_2$) or tris(4-methyl-8-quinolinolate)aluminum (Almq), which emits green light (540–550 nm). The blue light-emitting organic EML can be made of metal complex such as ZnPBO, Balq (Bis(8-hydroxyquinolato)-(4-phenylphenolato)aluminum), or of non-metal complex such as strylarylene-based derivatives DPVBi (4,4'-bis(2,2-diphenyl-vinyl)biphenyl), oxadiazole-based derivatives OXA-D, bisstrylanthrancene-based derivatives, bisstrylanthracene-based derivatives such as BczVBi (4,4'-Bis((2-carbazole)vinylene)biphenyl). Also, an organic dopant with high luminescent efficiency can be added into the organic EML to enhance the luminescent efficiency and the endurance of the organic EL device. Red light emitting EML can be also made by introducing organic dopants such as DCM or DCM2, into the organic EML such as Alq3. Known luminescent polymer such as PPP (poly(para-phenylenylene), PPV (poly(1,4-phenylene vinylene), PVK (polyvinyl carbazole) or polycarbonate can be also used as the organic EML.

The HIL and the HTL can be used so as to increase injection and transportation of holes from the anode 11 and to block electrons. TPD (triphenylamine derivatives; N,N'-bis (3-methylphenyl)-N,N'-diphenylbenzidine), strylamine derivatives or amine derivatives having fused aromatic ring, etc. may be used as the HIL and the HTL. The ETL for increasing injection and transportation of electrons from the cathode 16 to the organic EML and for blocking holes may be made of quinoline derivatives such as $Alq_3$.

The thickness of the HIL, the HTL, the organic EML and the ETL is not specifically defined and is dependent on the manufacturing method, and in general 5 nm through 800 nm. Not only multi-layered structure but also single layer structure can be also used for the organic EML. In any case, inorganic layer may be added to the above EL layer.

The anode 11 for injecting holes, may be made of ITO (Indium Tin Oxide), IZO (Indium Zin Oxide), polyaniline or Ag, which has relatively high work function. The cathode 16 for injecting electrons may be made of Al, Mg, Li, Ca, or complex compound thereof, which has relatively low work function. An inorganic layer such as LiF may be stacked under the cathode 16 at need. The third electrode 20 is made of a conductive organic material such as conductive organic monomer or conductive organic oligomer, a conductive inorganic material, a metal or complex thereof, preferably one selected from a group consisting of ITO, Ag, Al, Mg, Ca, Li, and compound thereof.

In such an OELD, the relative potential of the organic EL layer 22 and/or 26 with respect to the potentials of the first electrode 11 and the second electrode 16 can be adjusted by controlling voltage applied to the third electrode 20. Accordingly, the precise adjustment of current flow through the organic EL layers 22 and/or 26 can control a light emitting intensity by controlling the potential of the third electrode 20.

The detail of the triode organic EL device was described in Korean Patent Application Nos. 10-2001-32405 and 10-2001-65442 and a PCT application No. PCT/KR02/103. The OELD of the present invention uses the triode organic EL device referred to in specifications of the above-mentioned applications.

Merit of the triode organic EL device of the present invention with respect to the conventional two-terminal organic light-emitting diode device is high brightness of luminance under low driving voltage. Hereinafter, one experimental example of the triode organic EL device is described.

The triode organic EL device shown in FIG. 1a is manufactured. Aromatic amine of 4,4',4'-tris[N-3 methylphenyl-N-phenylamino], triphenylamine (mTDATA), 4,4'-bis[N-naphthyl-N-phenylamino] biphenyl (α-NPD) and Alq3 are sequentially deposited on the pixel electrode 11 (first electrode, anode) made of transparent ITO and the third electrode 20 which was made of transparent ITO near the pixel electrode (100 μm). Then Al:Li layer serving as the second layer 16 was formed thereon, thereby forming the triode organic EL device sample.

Figure 2A:
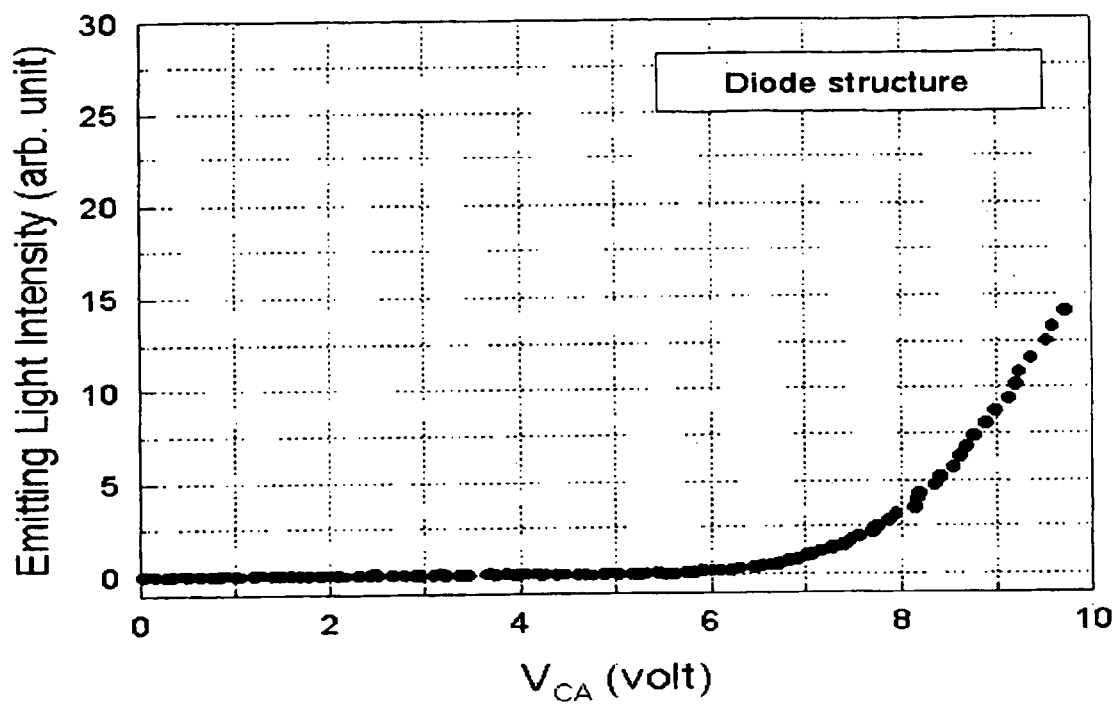
FIG. 2a is a graph showing an applied voltage vs. brightness of the conventional OLED employed in the OELD.
Figure 2B:
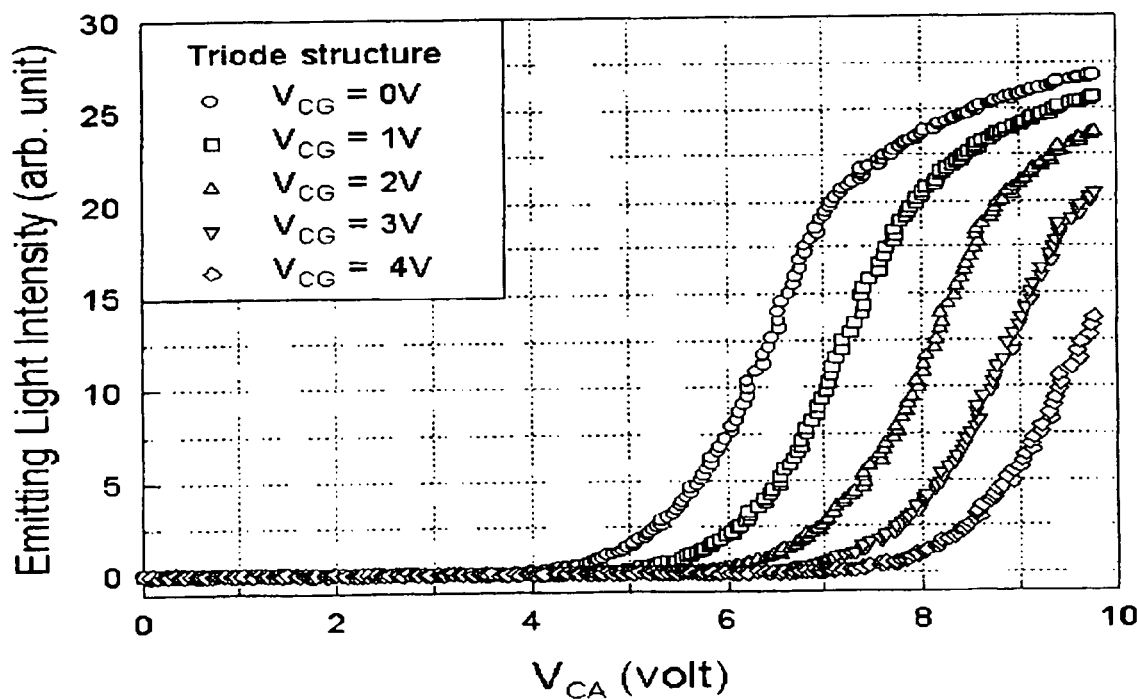
FIG. 2b is a graph showing an applied voltage vs. brightness of the present three-terminal (or triode) organic EL device employed in the OELD.

The thickness of each organic layer was: 40 nm of the mTDATA HIL, 20 nm of the α-NPD HTL, 60 nm of the EML and the ETL. The first electrode 11, the second electrode 16 and the third electrode 20 are connected to external circuits so as to have positive or negative potentials. FIG. 2a and FIG. 2b are graphs illustrating emitting light intensity vs. $V_{CA}$ with respect to potential of the third electrode 20 of the triode organic EL device.

After the third electrode 20 is disconnected from the external electric circuit, the voltage $V_{CA}$ is applied between the first electrode 11 and the second electrode 16. Then, the characteristics of emitting light intensity as a function of $V_{CA}$ was measured, as illustrated in FIG. 2a, for a comparative example. When the third electrode 20 is disconnected, an operation of the triode organic EL device is the same as that of the conventional OLED. That is, an electro-luminance is initially occurred near $V_{CA}$=6 V ($V_{ONSET}$) and the brightness of luminance is increased as the $V_{CA}$ is increased. As shown in FIG. 2a, the brightness near $V_{CA}$=9 V is 1000 (arb. Unit), so the voltage range of $V_{CA}$ for obtaining brightness of luminance within 1000 (arb. Unit) is from 6V to 9V and the controllable voltage range of $V_{CA}$ is about 3V.

On the other hand, characteristics of the emitting light intensity from the triode EL device under an applied voltage $V_{CG}$ of the third electrode 20 has been measured as a function of the voltage $V_{CA}$, as illustrated in FIG. 2b.

As shown in FIG. 2b, the voltage $V_{CA}$, at which the EL light is initially generated, is remarkably reduced below $V_{ONSET}$ (6V) as the voltage $V_{CG}$ is reduced. Moreover the brightness of the triode organic EL device under the low $V_{CA}$ is more highly increased than that of the conventional OLED. These characteristics cannot be achieved from the conventional two-terminal organic light-emitting diode device. Especially, as shown in FIG. 2b, when the voltage $V_{CG}$ is 0V, the EL light is generated near $V_{CA}$=4V and the brightness of luminance is gradually increased as the voltage $V_{CA}$ is increased. Here, the brightness at $V_{CA}$=9 V is 2500 (arb. Unit), so the voltage range of $V_{CA}$ for obtaining brightness of luminance within 2500 (arb. Unit) is from 4V to 9V. Thus the controllable voltage range of $V_{CA}$ is widely about 5V. That is, lowest limit of the controllable $V_{CA}$ is reduced to lower voltage and the controllable voltage range of $V_{CA}$ is more increased in comparison with the conventional two-terminal organic light-emitting diode device.

According to the experimental example, it is demonstrated that the driving voltage of the matrix type OELD employing the triode organic EL device can be reduced and therefore OELD exhibiting higher brightness with lower power consumption can be easily obtained.

While, the OELD employing the triode organic EL device may have a problem that the pixel area is reduced as the area of the third electrode is increased. Therefore, the applicant has contrived a technique in which a luminescent pixel area is not reduced even though the area of the third electrode is increased for manufacturing the OELD having triode organic EL device with high production yield.

From now, embodiments of the triode OELD devices having the substantially same pixel area as the pixel area of a conventional diode OELD will be explained. Same numerals are designated to the same elements.

Embodiment 1

FIGS. 3a through 3e are schematic plane views showing manufacturing steps of a passive matrix type OELD according to one embodiment of the present invention.

Figure 3A:
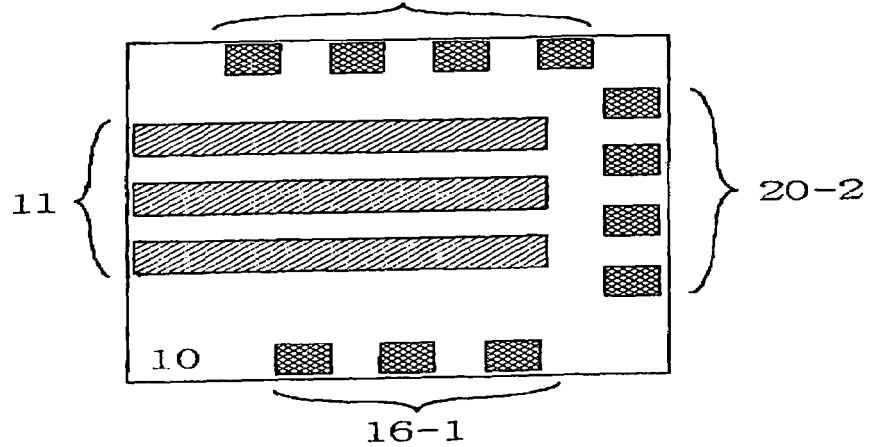
FIGS. 3a through 3e are schematic plane views showing manufacturing steps of the matrix-type OELD according to one embodiment of the present invention.

Referring to FIG. 3a, first electrodes 11 each of which is separated from one another in the form of stripe patterns are formed on a transparent substrate 10. Materials used in the conventional OELD can be also used for the substrate 10. And Materials having high mechanical strength and low permeability of moisture and oxygen can be used as materials of the substrate 10. For example, glass, quartz, crystallized glass or plastic can be used for the substrate 10. And semi-conductor such as silicon or gallium arsenide can be also used for the substrate 10 according to a structure and a use of the apparatus adopting the present OELD. The first electrodes 11 may be anodes or cathodes. When the first electrodes 11 are anodes, the first electrodes 11 are preferably made of conductive materials having excellent hole injection property and high work function (about 4.0 eV and more). Typically, materials for forming the anodes 11 are ITO, IZO, tin oxide and compound thereof. If a supplementary anode having high conductivity is used, the anode can be made of semiconductor because the resistance of the anode can be ignored. Specifically, metal such as Au, Ni, Pd and Pt, conductive oxides such as In—Sn—O, ZnO:Al (compound of ZnO containing Al), In—Zn—O and $SnO_2$:Sb (compound of $SnO_2$ containing Sb) or semiconductor such as amorphous silicon, polysilcon, amorphous silundum and amorphous carbon can be used for the anode 11. In addition, fully conjugated polymer of organic semiconductor such as polyaniline, polyarylenevinylene, polyphebylenevinylene, polyacetylene or polypyrrole can be used as the materials of the anode.

When the first electrodes 11 are cathodes, the first electrodes 11 are preferably made of conductive materials having excellent electron injecting property and low work function (about less 4.0 eV) such as metal or alloy thereof. Metal alloy used for forming the cathodes is metal containing a small amount of alkali earth metal, an alkali metal or an rare earth metal such as Al—Li, Al—Mg, Al—Ba, Al—Ca, Al—Sc and Al—Yb. A thin film of less than 20 nm made of alkali earth metal oxide such as BaO, SrO, and MgO can be used as the cathode. In addition, the cathode may be preferably composed of metal boride or metal nitride having low work function such as $LaB_6$ or TiN, rare earth metal silicide having low work function or compound of organic luminescent materials and metal.

The first electrodes 11 may be formed by well known methods. For example, a film for the first electrodes 11 is formed by sputtering and then patterned by the photolithography method to form the first electrodes 11. If necessary, pads 16-1 for second electrodes and pads 20-1 or 20-2 for third electrodes may be formed on the substrate 10.

Figure 3B:
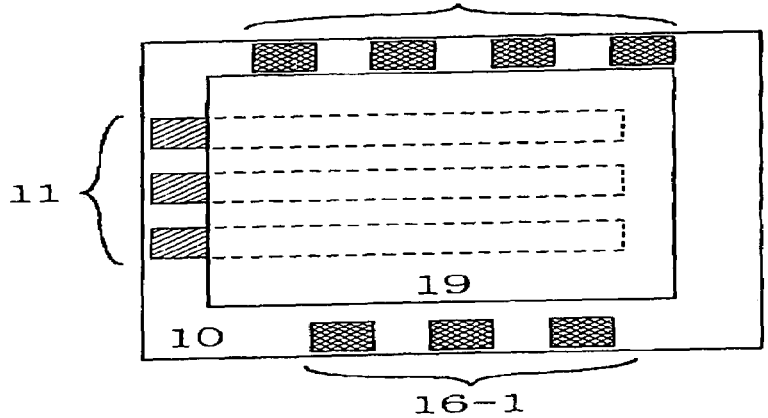
Figure 3C:
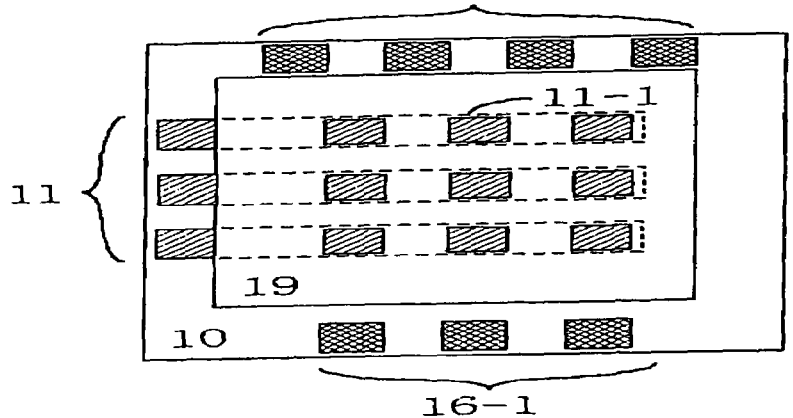

Referring to FIG. 3b, an electrically insulating layer 19 is formed on the surface of the substrate 10 on which the first electrodes 11 are formed. Then, as shown in FIG. 3c, parts of the electrically insulating layer 19 which are located on areas corresponding to the emission parts of the pixels are removed by the photolithography method so that parts 11-1 of the first electrodes 11 are exposed. The exposed parts 11-1 will become the emission parts of the pixels. Here, the pixel is composed of the emission part and non-emission part. The emission part is formed at an intersection part of the first electrodes and the second electrodes, which will be formed later, while the non-emission part is formed at a non-intersection of the first electrodes and the second electrodes or at an area where the first electrode and the second electrode are intersected but the electrons and the holes cannot be injected into the organic EL layer 22 and/or 26 due to the insulating body interposed between the first electrode and the second electrode.

Figure 3D:
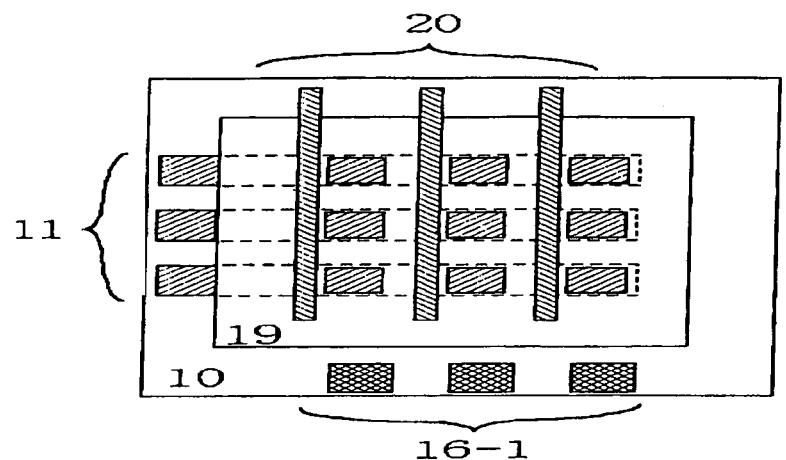

Referring to FIG. 3d, a plurality of third electrodes 20 each of which is separated from one another are made in form of stripes on the electrically insulating layer 19, which exposes the parts 11-1 of the first electrodes 11, with crossing the first electrode stripes 11. The third electrodes 20 can be formed by the conventional photolithography method by using photoresist. Since the third electrodes 20 are formed on the electrically insulating layer 19, the third electrodes 20 are formed at a different height level from the height level of the first electrodes 11 and also the third electrodes 20 are formed at the non-emission parts so as not to be overlapped with the emission parts. Accordingly, in the non-emission parts, the third electrodes 20 will be electrically connected to organic EL layer 22 and/or 26 that will be formed later.

In detail, the electrically insulating layer 19 is prepared for electrically isolating the first electrodes 11 from the third electrodes 20. The electrically insulating layer 19 is preferably composed of materials suitable for thin film. Specifically, the planarity of the electrically insulating layer 19 is preferably less than 0.2 μm. Materials of the electrically insulating layer 19 are not specifically limited as far as they show a high electrical insulation. For example, the electrically insulating layer 19 is preferably composed of materials having withstanding voltage of over 2 MV/cm and heat resistance enough to endure the temperature treatment during the fabrication of the device.

And the electrically insulating layer 19 is made of materials which can be patterned by photolithographic method, such as transparent polymers, oxides or glass. In detail, preferable transparent polymers include polyimide, flurorinated polyimide, fluoric resin, polyacrylate, polyquinoline, polyoxydiazole, cyclic-polyolefin, polycarbonate, polysulfan and ladder-like polysiloxane. Preferable oxides include $SiO_2$, $Al_2O_3$, $Ta_2O_3$, $Si_3N_4$, $SiO_2$ containing fluor, MgO and $YbO_3$. In addition, photoresist and hardening materials thereof can be used as materials for the electrically insulating layer 19. Preferably, the insulating layer 19 is composed of materials having water content of below 0.1 weight % and gas permeability coefficient of below $1 \times 10^{-13}$ cc·cm/$cm^2$·scm Hg considering the fact that the organic EL device is easily degraded by the moisture and oxygen. Accordingly, inorganic oxide, inorganic nitride or composite thereof may be used for the electrically insulating layer 19. The thickness of the electrically insulating layer 19 is not specifically limited as far as the third electrodes 20 can be formed thereon. For example, it is preferable that the thickness of the insulating layer 19 is thinner than that of the third electrodes 20 or less than 10 μm.

Metal used for the third electrodes 20 includes W, Al, Cu, Ag, Mo, Ta, Au, Cr, Ti, Nd and alloy thereof. And, metal silicides such as $TiSi_2$, $ZrSi_2$, $NbSi_2$, $TaSi_2$, $CrSi_2$, $WSi_2$, $CoSi_2$, $NiSi_2$, PtSi, $Pd_2Si$ can be used as the materials of the third electrodes 20. Further, the third electrodes 20 each may be composed of both metal and metal silicide.

The third electrodes 20 may be composed of single film, but the third electrode 20 may be preferably multi-layered structure that is composed of at least two kinds of materials so as to improve stability and conductivity thereof. Here, the stability means an anticorrosive property to solution used in an etching process with maintaining low resistance.

The thickness of the third electrode 20 preferably ranges from 100 μm through a several μm and more preferably ranges from 200 nm through 5 μm. If the thickness of the third electrode 20 is below 100 μm, the resistance of the third electrode 20 becomes undesirably high. If the thickness of the third electrode 20 is more than several μm, the planarization of the triode organic EL device cannot be made so that some defects may be produced in the OELD.

The width (length of the short side) of the third electrode 20 is preferably from 2 μm through 1000 μm and more preferably from 5 μm through 300 μm. If the width of the third electrode 20 is below 2 μm, the resistance of the third electrode 20 becomes undesirably high. If the width of the third electrode 20 is more than 1000 μm, the EL light emission from the OELD may be obstructed.

Figure 3E:
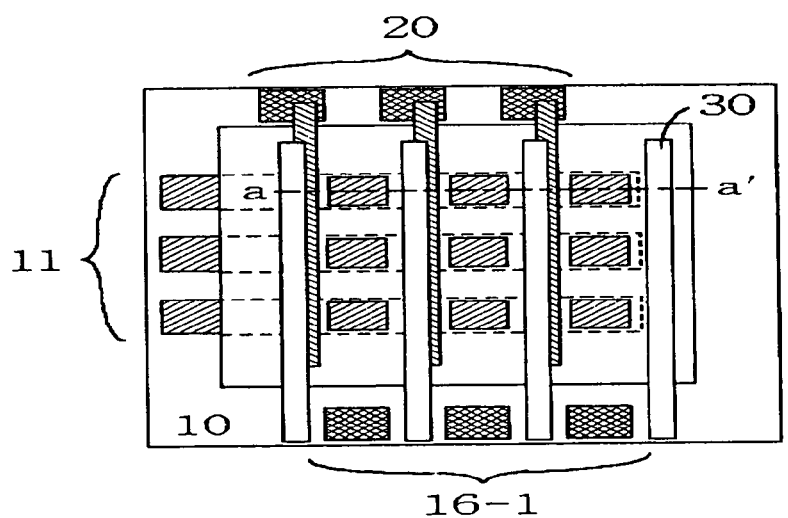

Next, referring to FIG. 3e, a plurality of separators 30 are formed parallel to the third electrodes 20 on the electrically insulating layers 19 and parts of the third electrodes 20. That is, the other parts of the third electrodes 20, which are adjacent to the emission parts, are exposed to an outside on the insulating layers 19. Therefore, the separators 30 divide the organic EL layer 22 and/or 26 and the second electrodes 16 of metal which will be formed later and the exposed parts of the third electrodes 20 are electrically connected to the organic EL layer 22 and/or 26 at the non-emission parts. The separators 30 can be formed by the conventional methods.

Thereafter the organic EL layer 22 and/or 26 is formed on the resultant, which is not shown in FIG. 3e. The shape of the organic EL layer 22 and/or 26 may be adjusted by using a shadow mask, and is not specifically limited so long as the organic EL layer 22 and/or 26 are formed on the exposed first electrodes 11 and exposed parts of the third electrodes 20 at the non-emission parts so as to be electrically connected to both the first electrodes 11 and the third electrodes 20. So, electrical connection between the organic EL layers 22 and/or 26 and the third electrodes 20 can be made, uniform brightness over a displaying area can be achieved and production yield of the OELD employing the triode organic EL device can be enhanced. Further, an electrically insulating layer (not shown) may be formed on the organic EL layer 22 and/or 26 in the non-emission parts, so the insulation between the electrodes in the adjacent pixels can be more improved.

The organic EL layer 22 and 26 include at least light-emitting layer. However, the organic EL layer 22 and/or 26 may be a single-layered structure composed of the light-emitting layer. In another way, the organic EL layer 22 and/or 26 may be a multi-layered structure composed of the HIL, the HTL, the EIL and the ETL as well as the EML. The luminescent materials which can be used for the organic EL layer 22 and/or 26 are not specifically limited and known materials, which used in the conventional organic EL display device, can be employed.

Next, the second electrodes 16 are formed on the organic EL layer 22 and/or 26, which are also not shown in FIG. 3e. The second electrodes 16 and the organic EL layer 22 and/or 26 are divided by the separators 30 and form a X-Y matrix together with the first electrodes 11. An intersection of the first electrodes each 11 and the second electrodes each 16 becomes the emission parts (emitting pixel part) of the OELD of the present invention. The first electrodes each 11 and the second electrodes each 16 form a pair. The second electrodes 16 have a potential with respect to the first electrodes 11. That is, if the first electrodes 11 are anodes, the second electrodes 16 are cathodes and inversely if the first electrodes 11 are cathodes, the second electrodes 16 are anodes. The electrons (or holes) which are injected from the first electrodes 11 and the holes (or electrons) which are injected from the second electrodes 16 are recombined to emit organic EL lights. Therefore, if the emission of organic EL lights is produced from the second electrodes 16, the second electrodes 16 are desirably composed of materials having light transmissivity of over 30% in the emission wavelength range. Transparent conductive oxide film, metal film or alloy film of less than 20 nm or stack film composed of the transparent conductive oxide film and metal/alloy film, which was used in the conventional OELD, can be adopted as materials satisfying the above condition.

Figure 4:
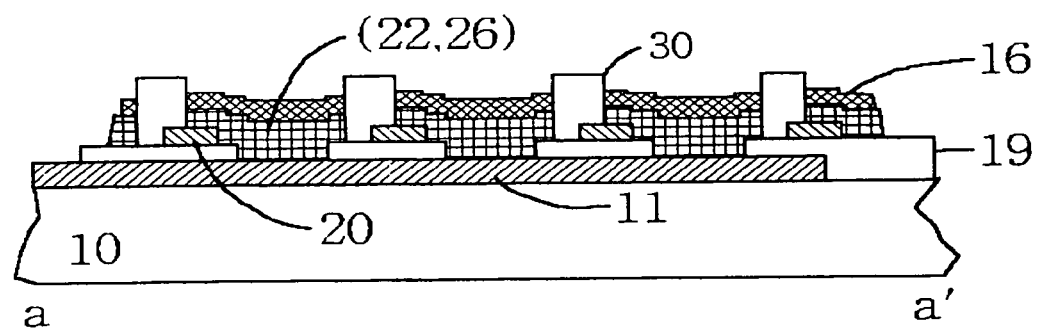
FIG. 4 depicts a schematic cross-sectional diagram of the OELD in FIG. 3e along a–a'.

The cross sectional view of the device, along a–a' in FIG. 3e is shown in FIG. 4. Referring to FIG. 4, the third electrode 20 is formed on the electrically insulating layer 19. And the third electrode 20 is connected to the organic EL layer 22 and/or 26. The second electrode 16 is isolated from an adjacent pixel by the separators 30. Accordingly, each of the third electrodes 20 is independently assigned to each pixel.

Figure 5A:
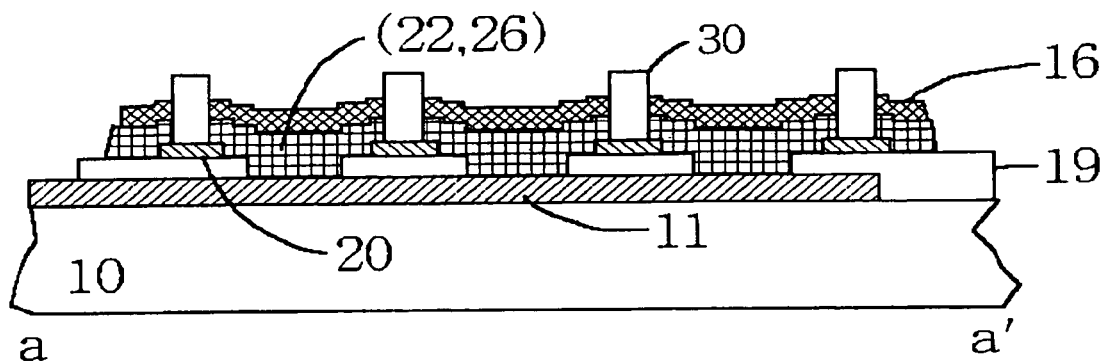
FIGS. 5a and 5b are schematic cross-sectional diagrams of the OELD wherein those are modified from the OELD in FIG. 4.

In forming the separators 30, the width of the separators 30 may be less than that of the third electrode 20 and the separators 30 may be formed only on the third electrodes 20, which are illustrated in FIG. 5a. Referring to FIG. 5a, single third electrode 20 is shared with two adjacent pixels and is electrically connected to the organic EL layer 22 and/or 26 in the non-emission parts. That is, single third electrode 20 electrically influences two adjacent triode organic EL devices and two third electrodes are included in single pixel. Comparing with the triode organic EL device of FIG. 4, merit of the triode organic EL device in FIG. 5a is that the potential of pixel can be variously adjusted by using two third electrodes. The area of the third electrode surrounding the emission part of the pixel can be increased to efficiently control the potential of the pixel.

Figure 5B:
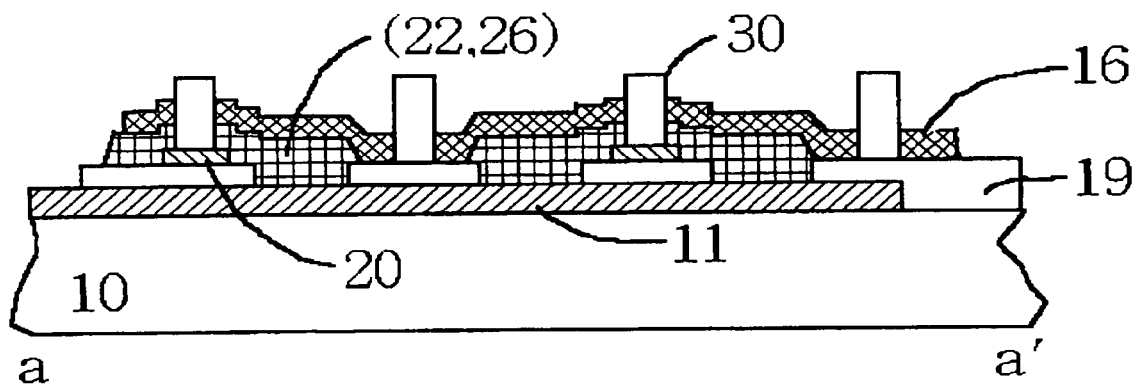

In another way, the third electrode 20 may be alternatively formed wherein the width of the separators 30 may be less than that of the third electrode 20 and the separators 30 may be formed only on the third electrodes 20, which is illustrated in FIG. 5b. Referring to FIG. 5b, single third electrode 20 is commonly connected to adjacent two pixels to electrically control the two triode organic EL devices. Comparing with the triode organic EL devices of FIGS. 4 and 5a, merit of the triode organic EL device in FIG. 5b is that the area of the emission parts can be increased because the area for forming the third electrode is decreased.

The above-mentioned triode organic EL devices in FIGS. 4, 5a and 5b are subjected to a packing process including a passivation and an encapsulation, thereby finishing the manufacture of the commercial OELD.

In the OELD adopting the triode organic EL device of FIGS. 4, 5a or 5b, an area where the third electrode 20 is electrically connected to the organic EL layer 22 and/or 26 does not overlap the emission parts of the OELD. Accordingly, intensity of radiation from the first electrodes 11 can be increased without decreasing the emission area of the pixel so that brightness of the OELD according to the present invention is also enhanced. In addition, since the third electrodes 20 are formed on the electrically insulating layer 19, the third electrodes 20 are sufficiently insulated from the first electrodes and an area for the third electrode 20 can be increased without electrical connection between the first electrode 11 and the third electrode 20. As a result, production yield of the OELD is increased and display defects such as crosstalk or line defect of non-emission line can be reduced.

In the present embodiment, only monochromatic pixel is explained. However, the present invention is not limited thereby and can be applied to full color pixel. In detail, in forming the EL layer of the triode organic EL device of the present invention, an EL layer which emits red light, an EL layer which emits green light and an EL layer which emits blue light may be simultaneously formed by using a shadow mask. Shape of slots of the shadow mask used is in form of stripe pattern or pixel matrix pattern. Another method for forming EL layer suitable for full color pixel includes a wet processing such as spin coating, printing or dipping. In addition, the EL layer for full color pixel includes a layer for providing a color display in cooperation with a color conversion layer or with a color filter when the EL device emits white light.

Further if a supplementary anode that is not shown in this embodiment, can be prepared, the injection of holes can be efficiently made. And current sink of conductor may be prepared between electrodes of adjacent pixels so as to reduce the crosstalk between the adjacent pixels.

Embodiment 2

Figure 6A:
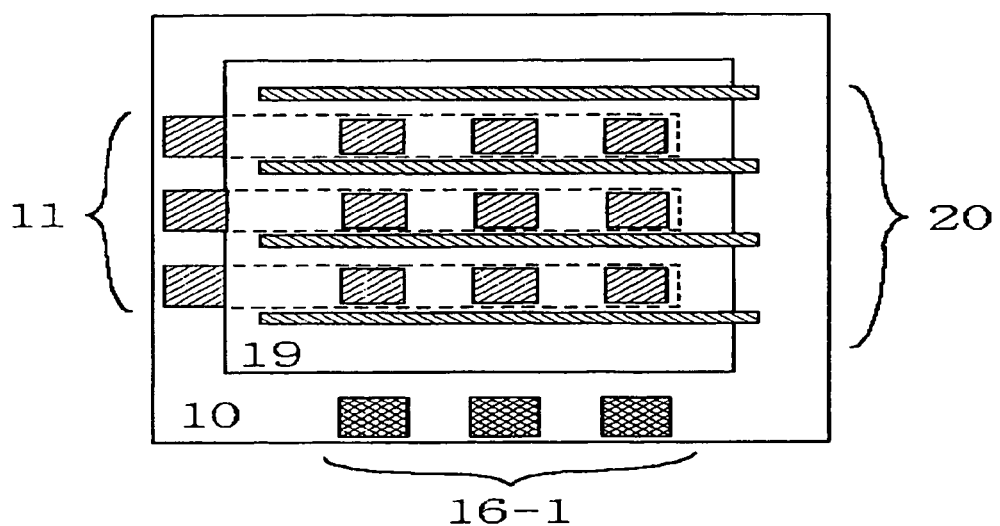
FIGS. 6a and 6b are schematic plane views showing manufacturing steps of the matrix-type OELD according to another embodiment of the present invention.
Figure 6B:
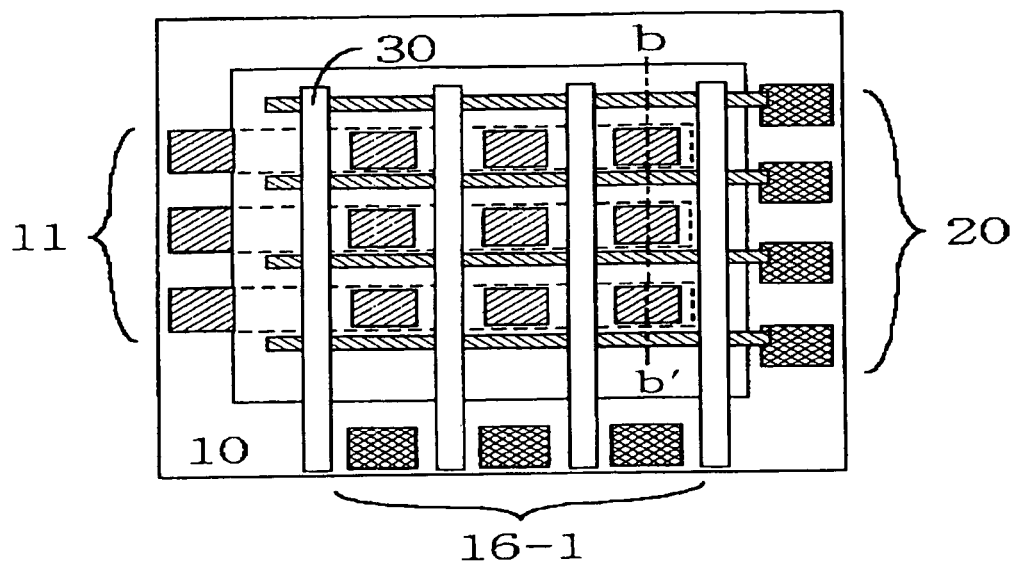
Figure 7:
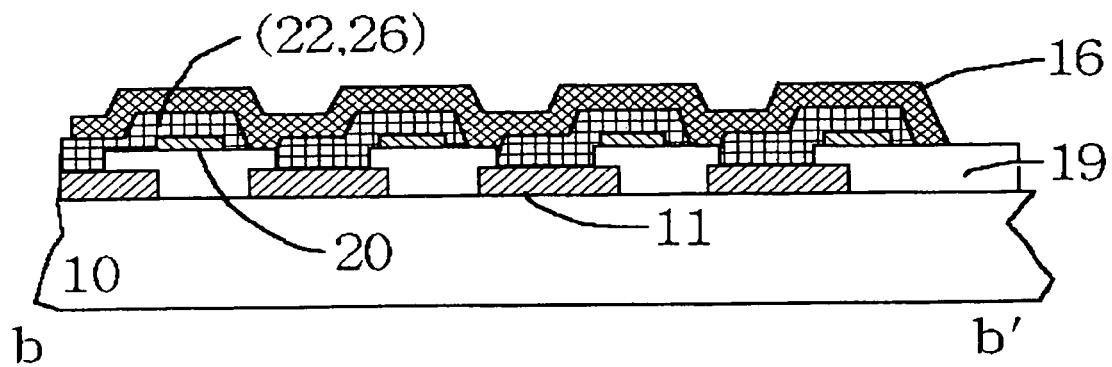
FIG. 7 depicts a schematic cross-sectional diagram of the OELD in FIG. 6b along b–b'.

FIGS. 6a–6b and FIG. 7 show schematic plane views and a cross-sectional view illustrating manufacturing steps of the passive matrix-type OELD according to another embodiment of the present invention.

Comparing with the OELD according to the embodiment 1, the difference lies in a position of the third electrode 20. Structure and materials of the other elements of the OELD are the same with those of the OELD according to the embodiment 1, so the detail explanation thereof will be omitted. Hereinafter, the third electrode 20 of this embodiment will be explained.

Referring to FIG. 6a, the third electrodes 20 are prepared in form of stripes parallel to the first electrodes 11 at the non-emission parts which are not over-lapped with the emission parts of the OELD. A plurality of pixels prepared on single first electrode 11 commonly share single third electrode stripe 20 that is parallel to the first electrode 11. Next, referring to FIG. 6b, the separators 30 crossing the third electrodes 20 are formed on the electrically insulating layer 19 and parts of the third electrodes 20. The organic EL layer 22 and/or 26 that is separated by pixel and the second electrode 16 are sequentially formed on the resultant structure. A cross sectional view of the OELD in FIG. 6b along b–b' is shown in FIG. 7. Here, the organic EL layer 22 and/or 26 separated by pixel indicate that wholly single organic EL layer 22 and/or 26 is divided and isolated in the arrangement direction of the first electrodes 11 by the separators 30.

As shown in FIG. 6b and FIG. 7, the organic EL layer 22 and/or 26 are electrically connected to the third electrode 20 at the non-emission part in each pixel and the organic EL layer 22 and/or 26 are formed among the first electrode 11, the second electrode 16 and the third electrode 20 which of each is isolated from one another.

Since the third electrode 20 is formed at the non-emission part, the area of the third electrode 20 can be increased without decreasing the area of the emission part and thus resistance of the third electrode 20 can be further reduced, thereby enhancing the uniformity of brightness.

Figure 8A:
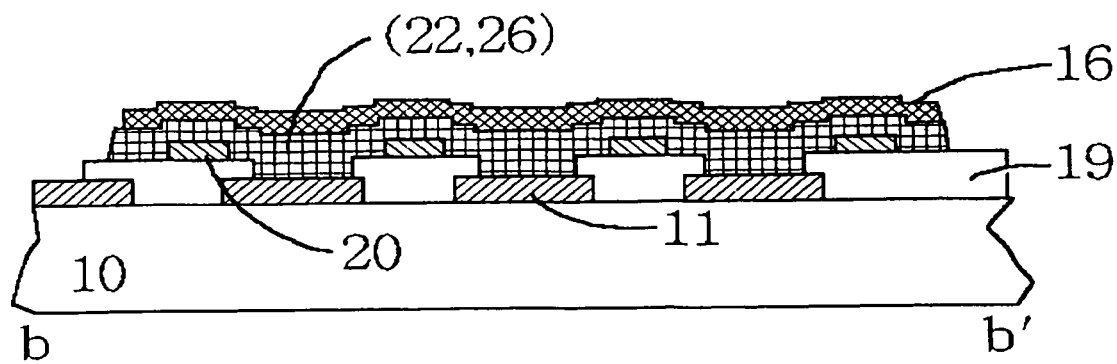
FIGS. 8a and 8b are schematic cross-sectional diagrams of the OELD wherein those are modified from the OELD in FIG. 7.

When forming the organic EL layer 22 and/or 26 after the separators 30 of FIG. 6b is formed, the organic EL layer 22 and/or 26 may be formed on entire surface of the resultant structure. The cross sectional view of such triode organic EL device of OELD is illustrated in FIG. 8a. Referring to FIG. 8a, single third electrode, that is commonly shared with two adjacent pixels, is electrically connected to the organic EL layer 22 and/or 26 at both sides thereof in the non-emission part so that single third electrode 20 electrically inflects two triode organic EL devices and single pixel contains two third electrodes 20. The advantages of the OELD in FIG. 8a over the OELD in FIG. 7 are that the potential of a pixel can be variously adjusted by using two third electrodes and the area of the third electrode surrounding the emission part of the pixel can be increased to efficiently control the potential of the pixel.

Figure 8B:
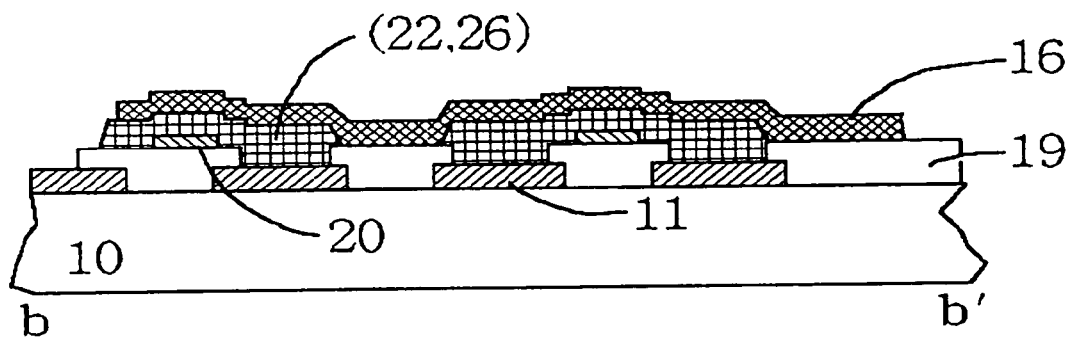

In another way, when forming the third electrode 20 in FIG. 6a, the third electrode 20 may be alternatively formed. And when forming the organic EL layer 22 and/or 26 in the following step, the organic EL layer 22 and/or 26 are separated by the electrically insulating layer 19, on which the third electrode 20 is not formed, and the separators 30. The cross sectional view of above-mentioned triode organic EL device of OELD is illustrated in FIG. 8b. In summary, single third electrode 20 is commonly connected to two pixels which are located at both sides thereof (which are referred to as "a pair of pixels") so that single third electrode 20 electrically controls the two triode organic EL devices. And a pair of pixels are isolated from another pair of pixels by the electrically insulating layer 19 on which the third electrode 20 is not formed and the separators 30, and the third electrode 20 is connected to the organic EL layers 22 and/or 26 of the pair of pixels in the non-emission parts. Thus, the prominent feature of the OELD in FIG. 8b over the OELDs in FIG. 7 and FIG. 8a is that the area of the effective emission part of the OELD is increased as the number of the third electrode 20 is decreased.

Embodiment 3

Figure 9A:
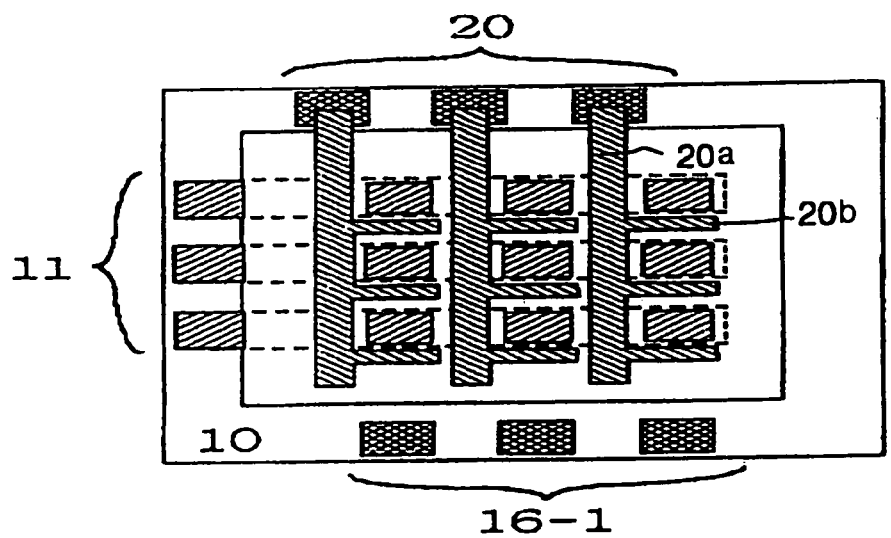
FIGS. 9a and 9b are schematic plane views showing manufacturing steps of the matrix-type OELD according to still another embodiment of the present invention.
Figure 9B:
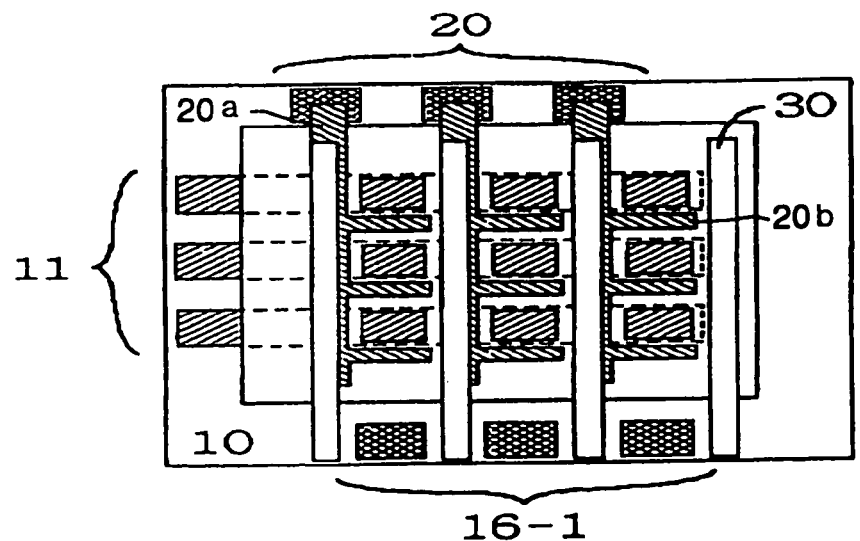
Figure 9C:
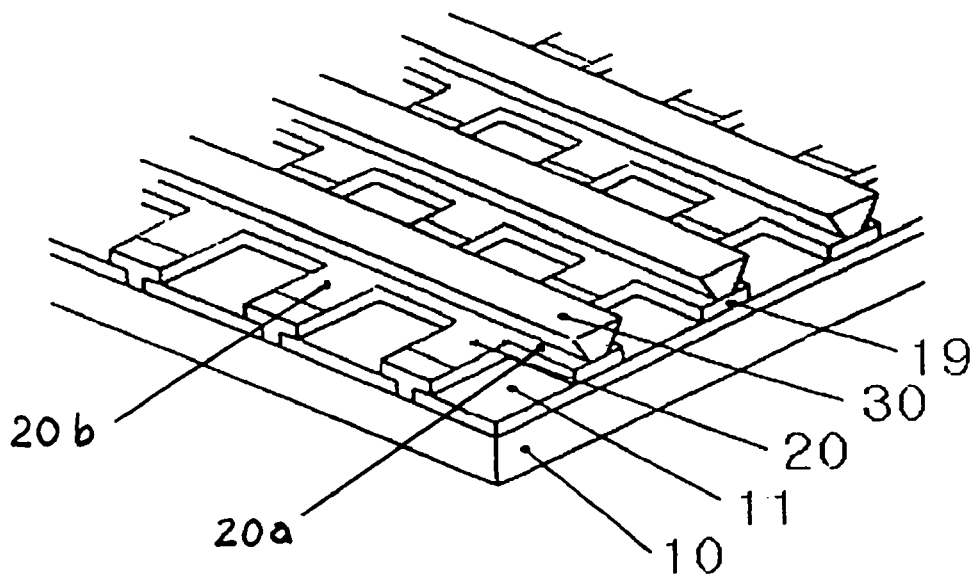
FIG. 9c is a perspective view of the OELD in FIG. 9b.

FIGS. 9a–9b and FIG. 9c are schematic plane views and perspective view showing manufacturing steps of the passive matrix-type OELD according to still another embodiment of the present invention.

Comparing with the OELD according to the embodiment 1, the difference lies in a position of the third electrode 20. Structure and materials of the other elements of the OELD are the same as those of the OELD according to the embodiment 1, so the detail explanation thereof will be omitted. Hereinafter, the third electrode 20 of this embodiment will be explained.

The shape of the third electrode 20 in this embodiment is the combination of those in embodiment 1 and the embodiment 2, as shown in FIG. 9a. Referring to FIG. 9a, the third electrodes 20 each is formed in the non-emission part and is composed of a first portion 20a crossing the first electrode 11 and a second portion 20b which is branched from the first portion 20a toward the adjacent first portion 20a. As shown in FIG. 9b and 9c, the separator 30 is arranged crossing the first electrode 11 on the first portion 20a of the third electrode 20. That is, since the third electrode 20 according to this embodiment is formed in the non-emission part so as to surround the emission part, the required area for the third electrode 20 can be increased without decreasing the area of the emission part. Thereby, resistance of the third electrode 20 can be further reduced and the uniformity of brightness over the displaying region can be enhanced.

The shape of the third electrode 20 of the pixel in the triode organic EL device is not limited by structure of FIG. 9b, and various shapes including ladder-like shape and grid-like shape can be adopted.

Embodiment 4

Figure 10A:
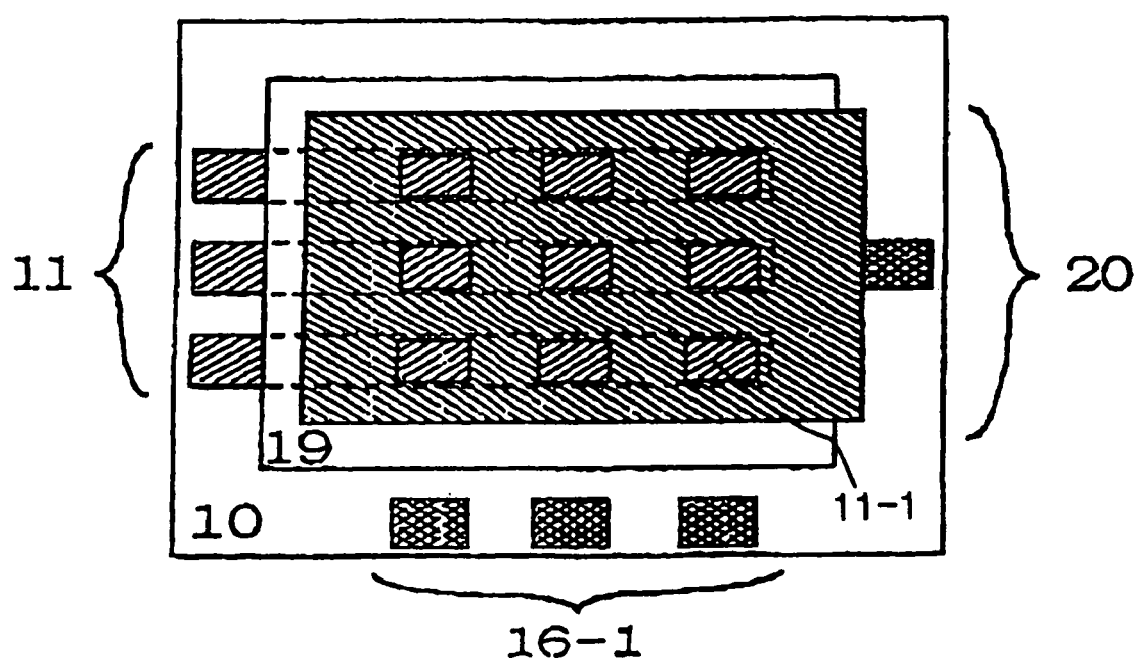
FIGS. 10a and 10b are schematic plane views showing manufacturing steps of the matrix-type OELD according to even still another embodiment of the present invention.
Figure 10B:
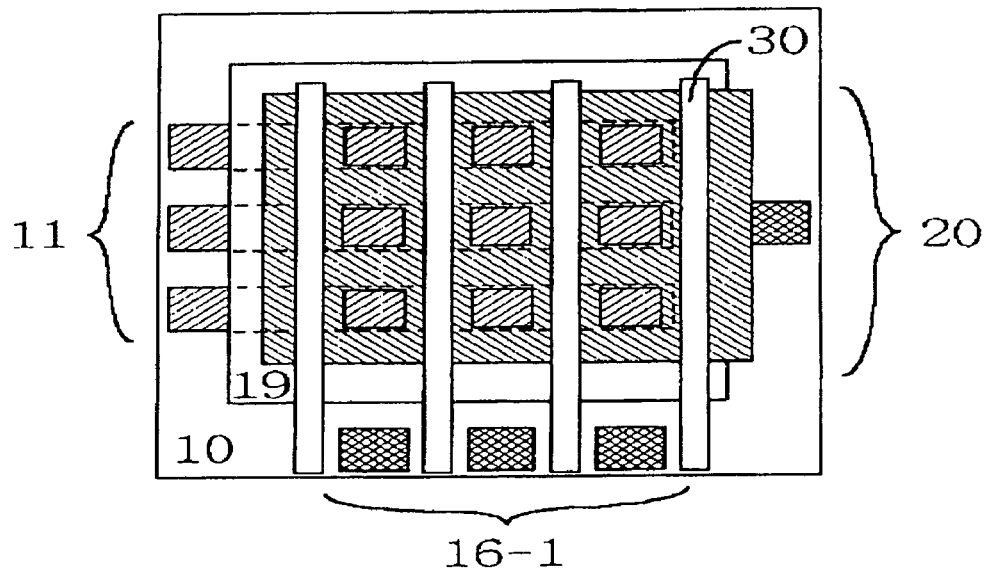
Figure 10C:
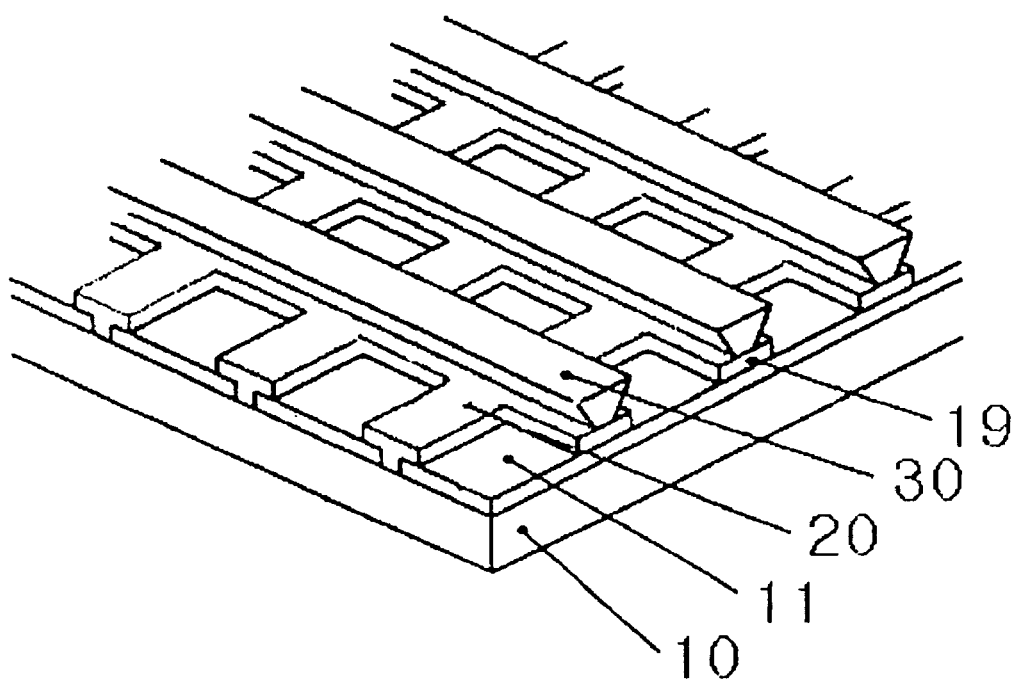
FIG. 10c is a perspective view of the OELD in FIG. 10b.

FIGS. 10a–10b and FIG. 10c are schematic plane views and a perspective views showing manufacturing steps of the passive matrix-type OELD according to still another embodiment of the present invention.

Comparing with the OELD according to the embodiment 1, the difference is the position of the third electrode 20. Structure and materials of the other elements of the OELD are the same as those of the OELD according to the embodiment 1, so the detail explanation thereof will be omitted. Hereinafter, the third electrode 20 of this embodiment will be explained.

Referring to FIG. 10*a*, the third electrode 20 is formed at the whole surface of the non-emission part which is formed on the electrically insulating layer 19 so that all pixels arranged in the matrix form commonly share single third electrode 20. As shown in FIGS. 10*b* and 10*c*, the separator 30 is arranged perpendicular to the first electrode 11 at the non-emission part. Therefore, the third electrode 20 according to this embodiment is electrically connected to the organic EL layer 22 and/or 26 in the non-emission part so that the required area of the third electrode 20 can be increased without decreasing the area of the emission part. Thereby resistance of the third electrode 20 can be further reduced and the uniformity of brightness over the displaying region can be enhanced.

In another way, the step for exposing the part 11-1 of the first electrode 11 is carried out by patterning the electrically insulating layer 19 simultaneously with forming the third electrode 20. In detail, the electrically insulating layer 19 is formed on the substrate 10, on which the first electrodes 11 are formed. Sequentially, materials for the third electrodes 20 are formed on the substrate and then the third electrodes 20 and the insulating layer 19 are patterned to expose the part 11-1 of the first electrode 11 that corresponds to the emission part. That is, at least two manufacturing steps can be reduced and thus production yield of the OELD can be increased.

The shape of the third electrode 20 of the pixel in the triode organic EL device is not limited by structures of FIG. 10*a*–10*c*, and various shapes can be adopted.

The present invention can be obviously applied to an active matrix-type OELD while only the passive matrix-type OELD is explained in the embodiment 1 through the embodiment 4. In the active matrix-type OELD employing the triode organic EL device according to the present invention, the electrically insulating layer is formed between the first electrode on the substrate and the third electrode so that the first electrode is located at a height level different from that on which the third electrode is formed. And the organic EL layer is connected to the third electrode in the non-emission part of the OELD and the second electrode is formed in the emission part. The shape and location of the third electrode are the same as those in the embodiment 1 through the embodiment 4.

The above-mentioned matrix-type OELD has low power consumption and uniform and high brightness so that it can be used as various electrical light sources and replace the LCD.

As described above, in the OELD of the present invention, since the first electrode and the third electrode are located at a different height level and the organic EL layer is connected to the third electrode in the non-emission part of the OELD, quantity of light emitted between the first electrode and the second electrode of the OELD can be increased and the brightness of the OELD can be enhanced regardless of considering the area for the third electrode. Also, the third electrode is formed in the non-emission part of the OELD so that the width and thickness of the third electrode can be enlarged and the wiring resistance of the third electrode can be reduced. Therefore, uniformity of the brightness of the OELD is increased, the power consumption owing to the third electrode is decreased and display defects such as crosstalk or line defect of non-emission line can be reduced. In addition, since the third electrode is formed on the electrically insulating layer in the OELD of the present invention, electrical isolation between the first electrodes, the second electrodes and the third electrodes can be sufficiently obtained.

Thus, in manufacturing an electrical appliance having bright displaying area and low power consumption, the matrix type OELD of the present invention can be adopted. The electrical appliances include a display, a television, a digital camera, a computer, a lap-top computer, a mobile computer, a portable reproducing instrument with recording medium, a screen, an electrical bulletin, an advertising board, a goggle type display, a display for automobile, a video camera, a printer display, a telecommunication device, a display for telephone, a mobile phone, an audio, a game player, a wireless portable information terminal, an electrical pocket book, an electrical book, a CD reproduction device, a luminescent accessory and a forward or a backward projector.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A matrix-type OELD having a triode organic EL device comprising:
   a plurality of first electrode stripes on a substrate;
   a patterned insulating layer formed on said substrate and said plurality of first electrodes stripes to expose parts of said plurality of first electrodes;
   a plurality of second electrodes formed on a part of said insulating layer excepting the exposed parts of the said plurality of first electrodes;
   an organic EL layer formed on said exposed parts of said plurality of the first electrodes and parts of said plurality of the second electrodes; and
   a plurality of third electrodes formed on the organic layer.

2. The matrix-type OELD of claim 1, wherein each of said plurality of second electrode stripes on said insulating layer crosses said plurality of first electrodes.

3. The matrix-type OELD of claim 2, further comprising a plurality of separators crossing said plurality of first electrodes on parts of said plurality of second electrodes.

4. The matrix-type OELD of claim 3, wherein said plurality of separators and said plurality of second electrodes are arranged by a ratio of 1:1, and wherein said plurality of separators covers parts of said plurality of second electrodes and parts of said insulating layer.

5. The matrix-type OELD of claim 3, wherein said plurality of separators and said plurality of second electrodes are arranged by a ratio of 1:1 and width of each of said plurality of separators is less than that of each of said plurality of second electrodes.

6. The matrix-type OELD of claim 3, wherein said plurality of separators and said plurality of second electrodes are arranged by a ratio of 2:1 so that said plurality of separators are formed on parts of said plurality of second electrodes and on said insulating layer positioned between adjacent two second electrodes and wherein width of each of said plurality of separating layers is less than that of each of said plurality of second electrodes.

7. The matrix-type OELD of claim 1, wherein each of said plurality of second electrode stripes parallel to said plurality of first electrodes on said insulating layer excepting the exposed parts of said plurality of first electrodes.

8. The matrix-type OELD of claim 7, further comprising a plurality of separators which crosses said plurality of first electrodes on said plurality of second electrodes.

9. The matrix-type OELD of claim 8, wherein said organic EL layer includes a plurality of sub-organic EL layers each separated from one another in an arrangement direction of said plurality of first electrodes.

10. The matrix-type OELD of claim 8, wherein said plurality of separators and said plurality of second electrodes are arranged by a ratio of 2:1 and wherein said organic EL layer is composed of a plurality of sub-organic EL layers each of which is positioned from an one end of said insulating layer on which said plurality of second electrodes are not formed to one end of next adjacent insulating layer on which said plurality of second electrodes are not formed.

11. The matrix-type OELD of claim 1, wherein each of said plurality of second electrodes includes a first portion crossing said plurality of first electrodes and a plurality of second portions which are branched from the first portion to a region between adjacent first electrodes.

12. The matrix-type OELD of claim 11, further comprising a plurality of separators which crosses said plurality of first electrodes on said plurality of second electrodes.

13. The matrix-type OELD of claim 1, wherein said plurality of second electrodes are formed on whole surface of said insulating layer excepting the exposed parts of said plurality of first electrodes.

14. The matrix-type OELD of claim 13, further comprising a plurality of separators which crosses said plurality of first electrodes on said plurality of second electrodes.

15. The matrix-type OELD of claim 1, wherein said plurality of first electrodes and said plurality of third electrodes are composed of at least one selected from Al, Ca, Ma, Li, Ag, Ba and compound thereof or at least one selected from ITO, IZO and compound thereof and said plurality of second electrodes are composed of at least one selected from W, Al, Cu, Ag, Mo, Ta, Au, Cr, Ti, Nd, $TiSi_2$, $ZrSi_2$, $NbSi_2$, $CrSi_2$, $WSi_2$, $CoSi_2$, $NiSi_2$, PtSi, $Pd_2Si$ and compound thereof or at least one selected from ITO, IZO and compound thereof.

16. The matrix-type OELD of claim 1, wherein said insulating layer is composed of at least one selected from polyimide, flurorinated polyimide, fluoric resin, polyacrylate, polyquinoline, polyoxydiazole, cyclic-polyolefin, polycarbonate, polysulfan and ladder-like polysiloxane, or at least one selected from $SiO_2$, $Al_2O_3$, $Ta_2O_3$, $Si_3N_4$, $SiO_2$ containing fluor, MgO and $YbO_3$, or photoresist, organic insulating layer having photosensivity or hardening materials of the photoresist or organic insulating layer.

\* \* \* \* \*